(12) United States Patent
Zhang et al.

(10) Patent No.: US 9,717,156 B2
(45) Date of Patent: Jul. 25, 2017

(54) ELECTRICAL SOCKET CONNECTOR WITH GUIDE FRAME IC CHIP PLACEMENT

(71) Applicant: LOTES CO., LTD, Keelung (TW)

(72) Inventors: Hao Zhang, Keelung (TW); Yin Liang He, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/157,815

(22) Filed: May 18, 2016

(65) Prior Publication Data

US 2017/0005425 A1    Jan. 5, 2017

(30) Foreign Application Priority Data

Jul. 3, 2015  (CN) ..................... 2015 2 0471305 U
Sep. 29, 2015  (CN) ..................... 2015 2 0767583 U

(51) Int. Cl.
  H01R 13/62  (2006.01)
  H05K 7/00   (2006.01)
  G06F 1/00   (2006.01)

(52) U.S. Cl.
  CPC ...... *H05K 7/00* (2013.01); *G06F 1/00* (2013.01)

(58) Field of Classification Search
  CPC ...................................................... H01R 12/88
  USPC ................ 439/261, 266, 268, 326, 310, 331
  See application file for complete search history.

(56) References Cited

U.S. PATENT DOCUMENTS

| | | | | |
|---|---|---|---|---|
| 5,109,980 A * | 5/1992 | Matsuoka | ............ | H05K 7/1069 206/724 |
| 5,244,404 A * | 9/1993 | Kishi | .................... | H05K 7/1023 439/331 |
| 5,326,271 A * | 7/1994 | Kishi | .................... | H05K 7/1023 439/331 |
| 7,014,477 B2 * | 3/2006 | Tsai | ..................... | H05K 7/1069 439/331 |
| 7,160,128 B2 * | 1/2007 | Ma | ....................... | H05K 7/1053 439/331 |
| 7,182,619 B2 * | 2/2007 | Hsu | ..................... | H05K 7/1053 439/331 |
| 7,258,563 B2 * | 8/2007 | Ju | .......................... | H01R 12/88 439/331 |
| 7,473,121 B2 * | 1/2009 | Fan | ..................... | H01L 23/4093 257/E23.086 |
| 7,794,261 B2 * | 9/2010 | Terhune, IV | ........ | H01R 13/193 439/331 |
| 7,815,455 B2 * | 10/2010 | Liao | ..................... | H05K 7/1053 439/331 |

(Continued)

*Primary Examiner* — Tulsidas C Patel
*Assistant Examiner* — Peter G Leigh
(74) *Attorney, Agent, or Firm* — Locke Lord LLP; Tim Tingkang Xia, Esq.

(57) ABSTRACT

An electrical connector for electrically connecting a chip module, including an insulating body, multiple terminals fixed to the insulating body, a stiffener surrounding the periphery of the insulating body, a carrier for carrying the chip module onto the insulating body, and a load plate for pressing the chip module. The terminals are used for electrically connecting the chip module. The stiffener has a first pivoting portion and a second pivoting portion. The first pivoting portion is located in front of the second pivoting portion, and the first pivoting portion and the second pivoting portion are located on the same side of the insulating body. A rear end of the carrier is pivoted to the first pivoting portion, and a rear end of the load plate is pivoted to the second pivoting portion.

30 Claims, 13 Drawing Sheets

(56) References Cited

U.S. PATENT DOCUMENTS

| | | | | |
|---|---|---|---|---|
| 7,828,577 B2* | 11/2010 | Yeh | ................... | H05K 7/1007 |
| | | | | 439/330 |
| 7,845,964 B2* | 12/2010 | Fan | ................... | H05K 7/1007 |
| | | | | 439/331 |
| 7,927,121 B2* | 4/2011 | Ma | ................... | H05K 7/1053 |
| | | | | 439/331 |
| 8,123,543 B1* | 2/2012 | Terhune, IV | ........ | H05K 7/1061 |
| | | | | 439/331 |
| 8,279,606 B2* | 10/2012 | Kyle | ................... | G06F 1/181 |
| | | | | 165/185 |
| 8,353,708 B2* | 1/2013 | Hsu | ................... | H05K 7/1007 |
| | | | | 439/67 |
| 8,439,693 B2* | 5/2013 | Yeh | ................... | H01R 12/88 |
| | | | | 439/135 |
| 8,905,765 B2* | 12/2014 | Yeh | ................... | H05K 7/00 |
| | | | | 439/331 |
| 8,979,566 B2* | 3/2015 | Yeh | ................. | H01R 13/62933 |
| | | | | 439/331 |
| 9,054,473 B2* | 6/2015 | Kyle | ................... | G06F 1/181 |
| 9,184,531 B2* | 11/2015 | Chen | ................... | H01R 13/518 |
| 9,192,070 B2* | 11/2015 | Tan | ................... | H05K 7/10 |
| 9,214,754 B2* | 12/2015 | Yeh | ................... | H05K 7/1053 |
| 9,270,035 B2* | 2/2016 | Yeh | ................... | H01R 4/48 |
| 9,332,666 B2* | 5/2016 | Yeh | ................... | H05K 7/1061 |
| 9,368,888 B2* | 6/2016 | Yeh | ................... | H01R 12/7058 |
| 2001/0000765 A1* | 5/2001 | Fukunaga | .......... | H01R 13/193 |
| | | | | 439/342 |
| 2012/0156919 A1* | 6/2012 | Yeh | ................... | H05K 7/1007 |
| | | | | 439/370 |
| 2013/0322037 A1* | 12/2013 | Tan | ................... | H05K 7/10 |
| | | | | 361/752 |

* cited by examiner

ELECTRICAL SOCKET CONNECTOR WITH GUIDE FRAME IC CHIP PLACEMENT

CROSS-REFERENCE TO RELATED APPLICATION

This non-provisional application claims priority to and benefit of, under 35 U.S.C. §119(a), Patent Application Nos. 201520471305.0 filed in P.R. China on Jul. 3, 2015, and 201520767583.0 filed in P.R. China on Sep. 29, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector for electrically connecting a chip module.

BACKGROUND OF THE INVENTION

Chinese Patent Application No. 201210217573.0 discloses an electrical connector used for electrically connecting a chip module to a printed circuit board. The electrical connector includes an insulating body having conductive terminals received therein, a reinforce member located at outside of the insulating body, a lever and a connecting rod installed to two opposite ends of the reinforce member, and a load plate and a holding member installed to the reinforce member. The reinforce member is provided with a first end and a second end opposite to the first end. The holding member and the lever are installed to the first end of the reinforce member, and the load plate and the connecting rod are installed to the second end of the reinforce member. The holding member includes a rotating member installed to the first end of the reinforce member, an elastic member located between the rotating member and the reinforce member, a shaft fixing the rotating member and the elastic member onto the reinforce member, and a clamping member installed onto the rotating member and used for fixing the chip module. The clamping member includes a frame-shaped body portion, a guide portion extending downward from the body portion, a grasping portion extending outward from the body portion, and an assembling portion extending outward from the body portion. The body portion is provided with multiple positioning portions extending downward. The positioning portions jointly form a space that receives the chip module. When the electrical connector is in use, the chip module is fixed onto the clamping member through pasting or in other manners, the clamping member is installed onto the rotating member, the lever, the connecting rod and the load plate are opened by rotation to make the lever, the connecting rod and the load plate in an on state, the grasping portion of the clamping member is pressed to make it rotate and close so as to install the chip module onto the insulating body, the guide portion of the clamping member locates on the outside of the insulating body to make the chip module and the conductive terminals aligned accurately, the load plate, the connecting rod and the lever are closed by rotation, a second operating lever of the connecting rod is buckled onto a first buckling portion of a first fixing member, a first operating lever of the connecting rod is buckled onto a second buckling portion of a second fixing member, and a first pressing portion of the lever is pressed onto the tongue of the load plate, to make the load plate provide a pressing force for the chip module, which effectively ensures good electrical connections between the chip module and the conductive terminals. As the load plate and the holding member are opened respectively on two opposite ends of the reinforce member, the load plate and the holding member occupy a greater space of the circuit board, resulting in that it is easy to contact other electronic elements on the circuit board.

Therefore, a heretofore unaddressed need exists in the art to address the aforementioned deficiencies and inadequacies.

SUMMARY OF THE INVENTION

In one aspect, the present invention relates to an electrical connector that saves space.

In one embodiment, an electrical connector for electrically connecting a chip module includes an insulating body, multiple terminals received in the insulating body, a stiffener surrounding the periphery of the insulating body, a carrier for carrying the chip module onto the insulating body, and a load plate for pressing the chip module. The multiple terminals are used for electrically connecting the chip module. The stiffener has a first pivoting portion and a second pivoting portion. The first pivoting portion is located in front of the second pivoting portion, and the first pivoting portion and the second pivoting portion are located on the same side of the insulating body. A rear end of the carrier is pivoted to the first pivoting portion, and a rear end of the load plate is pivoted to the second pivoting portion.

In one embodiment, the carrier includes a guide frame pivoted to the first pivoting portion and a clamping member for fixing the chip module. The guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails.

In one embodiment, when the clamping member is assembled on the guide frame and the guide frame moves towards a closing direction to be installed on the insulating body, the sliding rails are located on two opposite sides of the insulating body and located between the stiffener and the side plates.

In one embodiment, a height of the guide member is not higher than an upper surface of the side plate.

In one embodiment, an upper surface of each of the sliding rails is not higher than an upper surface of the insulating body.

In one embodiment, a resisting portion extends from each of the sliding rails along a length direction of the sliding rail, an upper surface of each of the resisting portions is higher than an upper surface of the corresponding sliding rail, and the resisting portion resists the stiffener downward.

In one embodiment, a first stopping portion is formed by extending upward from each of the sliding rails to be stopped to a side edge of corresponding one of the side plates, a second stopping portion is formed by extending horizontally from each of the first stopping portion, a front end of each of the second stopping portions has a guide surface for guiding the clamping member to be assembled to the guide frame, a front end of each of the first stopping portion is flush with a front end of corresponding one of the sliding rails, and the front end of each of the second stopping portion is not flush with the front end of corresponding one of the sliding rails.

In one embodiment, a groove is concavely disposed from an upper surface of the side plate, the second stopping portion is stopped above the groove, and the second stopping portion is not higher than the upper surface of the side plate.

In one embodiment, the insulating body has a positioning slot and a concave portion located in front of the positioning slot, the clamping member has a positioning portion corresponding to the positioning slot, the guide frame has a hook portion corresponding to the concave portion, and in a process that the carrier is installed to the insulating body downward, the positioning portion first cooperates with the positioning slot to position the carrier and then the hook portion cooperates with the concave portion to buckle the carrier to the insulating body.

In one embodiment, the positioning portion is a big-end-up cylinder, and the positioning hole penetrates the insulating body up and down.

In one embodiment, the clamping member is horizontally convexly provided with a protruding block, the positioning portion protrudes from a lower surface of the protruding block, and the guide frame is provided with a receiving groove to receive the protruding block.

In one embodiment, the guide member comprises a plastic member and a metal member insert molded to the plastic member, the plastic member has two opposite side arms and a pivoting arm connected to the two side arms, the side arms are provided with the sliding rails, and the pivoting arm is pivoted to the first pivoting portion.

In one embodiment, the metal member is provided with two opposite first arms, and a second arm and a third arm connected to the two first arms, the first arms are insert molded into the side arms and the first arms go beyond the side arms along their length directions, the second arm is insert molded into the pivoting arm, and the third arm bends downward from the first arms to reserve the clamping member when the clamping member is installed to the guide member.

In one embodiment, the stiffener is provided with a reserved slot to receive the third arm.

In one embodiment, a grasping portion protrudes forward from the clamping member, two sides of the grasping portion have grasp spaces, and the grasp spaces are in communication with the opening.

In one embodiment, the load plate is provided with a through hole for receiving the chip module, and the load plate is provided with a receiving hole in each of front of and behind the through hole for a locking member to pass through to fix the load plate onto the stiffener.

In one embodiment, the load plate is provided with two protruding portions and a bending portion pivoted to the second pivoting portion, the bending portion is located between the two protruding portions, and each of the two protruding portions is provided with the receiving hole.

In one embodiment, a grasping portion protrudes forward from the carrier, and the grasping portion is provided with a perforation located below the receiving hole for the locked member to pass through.

In one embodiment, the load plate has an through hole for receiving the chip module, and two side portions extending from a left side and a right side of the through hole; the guide frame has an operating portion extending upward from a left or a right side of the guide frame to guide rotation of the guide frame; and when the load plate is in a closed state, the operating portion is located at a front of corresponding one of the side portions, the operating portion has a chamfer disposed at a rear side, the chamfers, from bottom upward, is slant away from the corresponding one of the side portions.

In one embodiment, both the left side and the right side of the guide frame has the operating portion, the operating portions are located in a front of the sliding rails, and when the clamping member is slidably assembled to the guide frame, the operating portions stop at a left side and a right side of the clamping portion.

In one embodiment, the operating portion has a connecting portion extending upward, and a holding portion bending and extending laterally from the connecting portion, and the holding portion extends frontward and exceeds the connecting portion.

In one embodiment, a side of the load plate is provided with two first pressing portions and a second pressing portion located between the first pressing portions, for pressing the chip module, a width of the second pressing portion in a left and right direction is greater than a width of the first pressing portions in a left and right direction.

In one embodiment, the load plate has a through hole for receiving the chip module, a bottom surface of the load plate is protruded with a third pressing portion for pressing the chip module, and the third pressing portion extends from one side of the through hole to an opposite side of the through hole.

Compared with the related art, in certain embodiment of the present invention, the stiffener is provided with the first pivoting portion and the second pivoting portion which are located on the same side of the insulating body, the carrier is pivoted to the first pivoting portion, and the load plate is pivoted to the second pivoting portion, so that the carrier and the load plate are opened on the same side of the insulating body, thus occupying a small space of the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
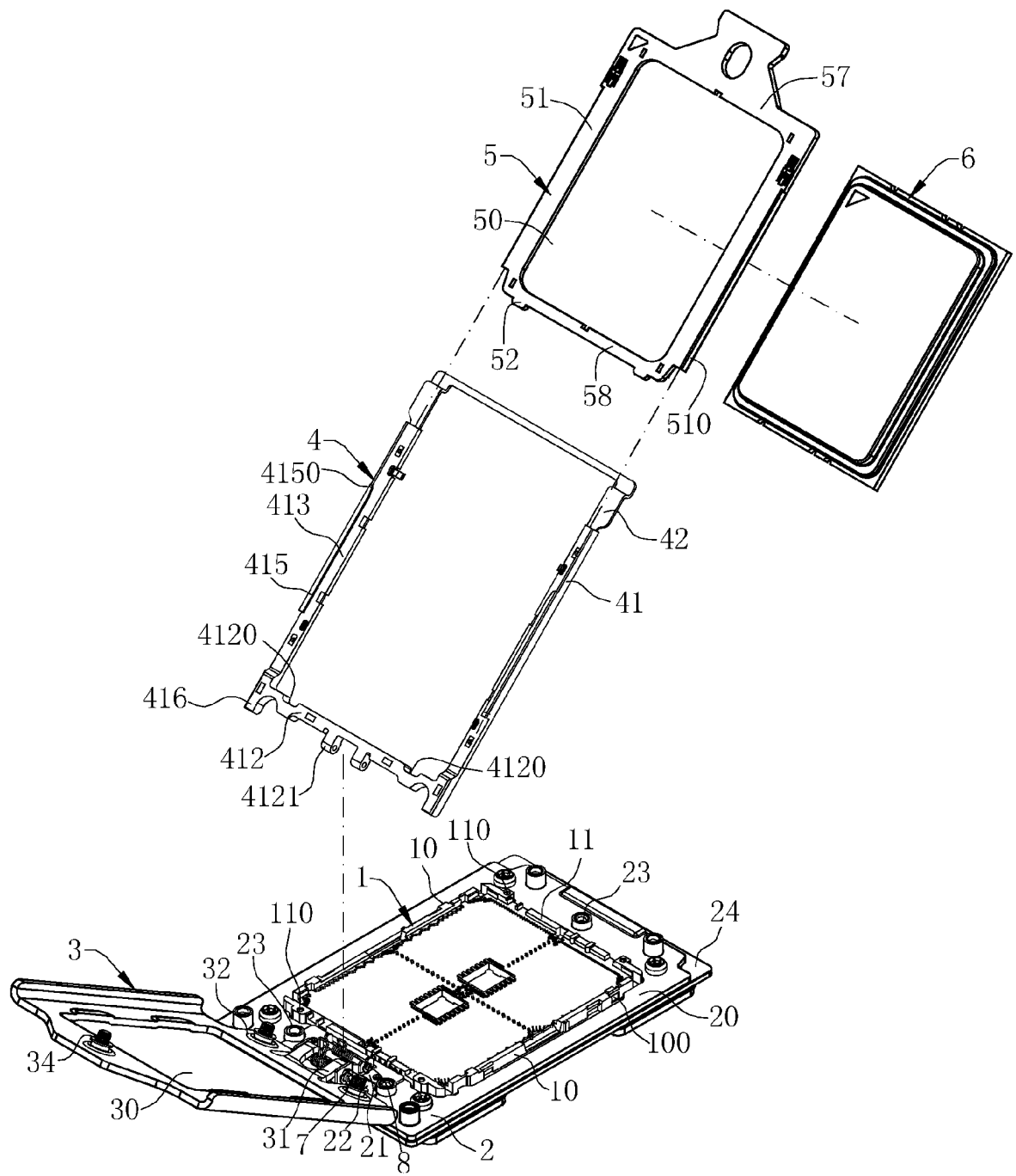
FIG. 1 is a schematic three-dimensional exploded view of an electrical connector according to a first embodiment of the present invention.
Figure 2:
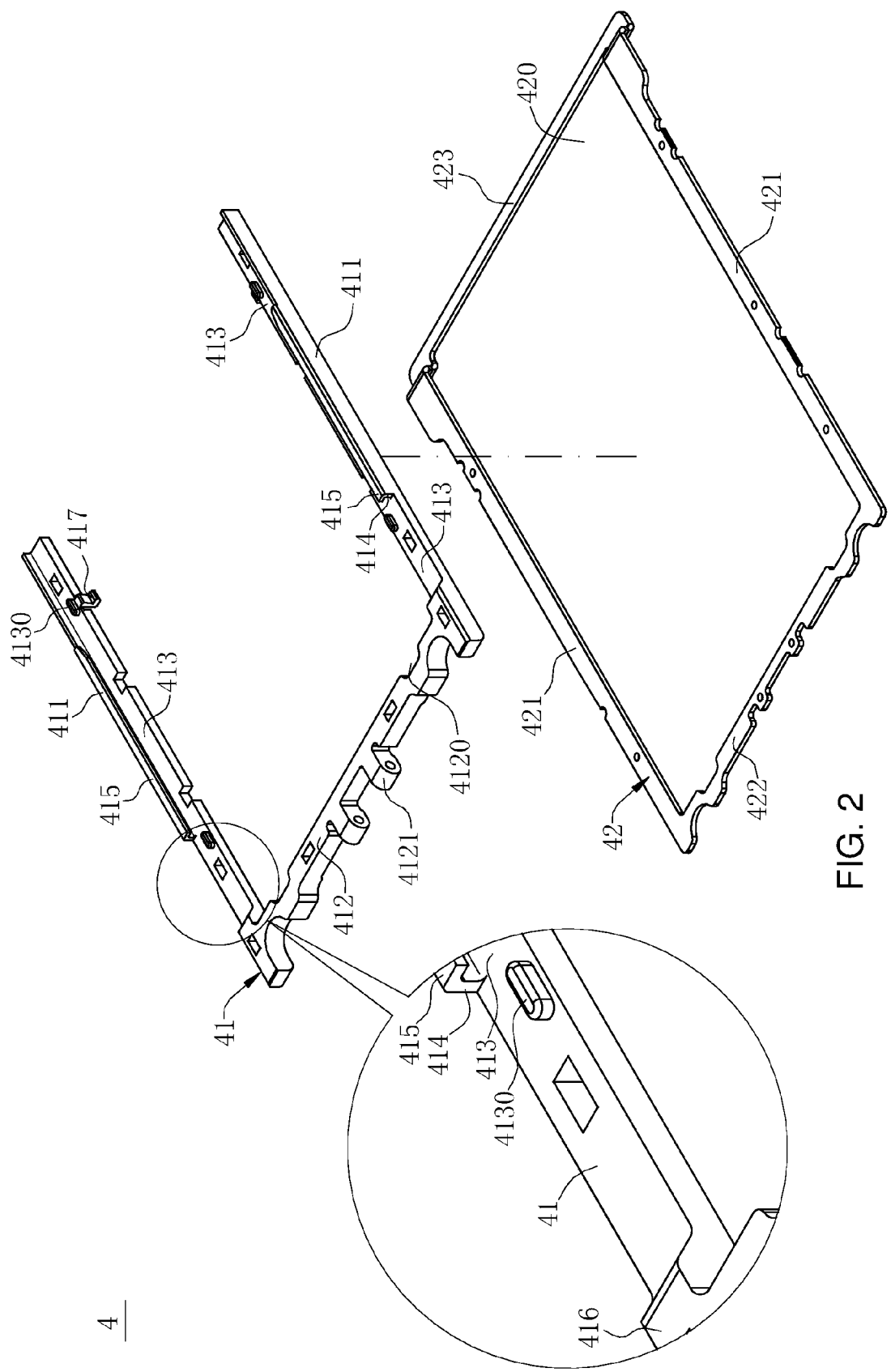
FIG. 2 is a schematic exploded view of a guide frame of the electrical connector according to the first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an electrical connector.

Figure 4:
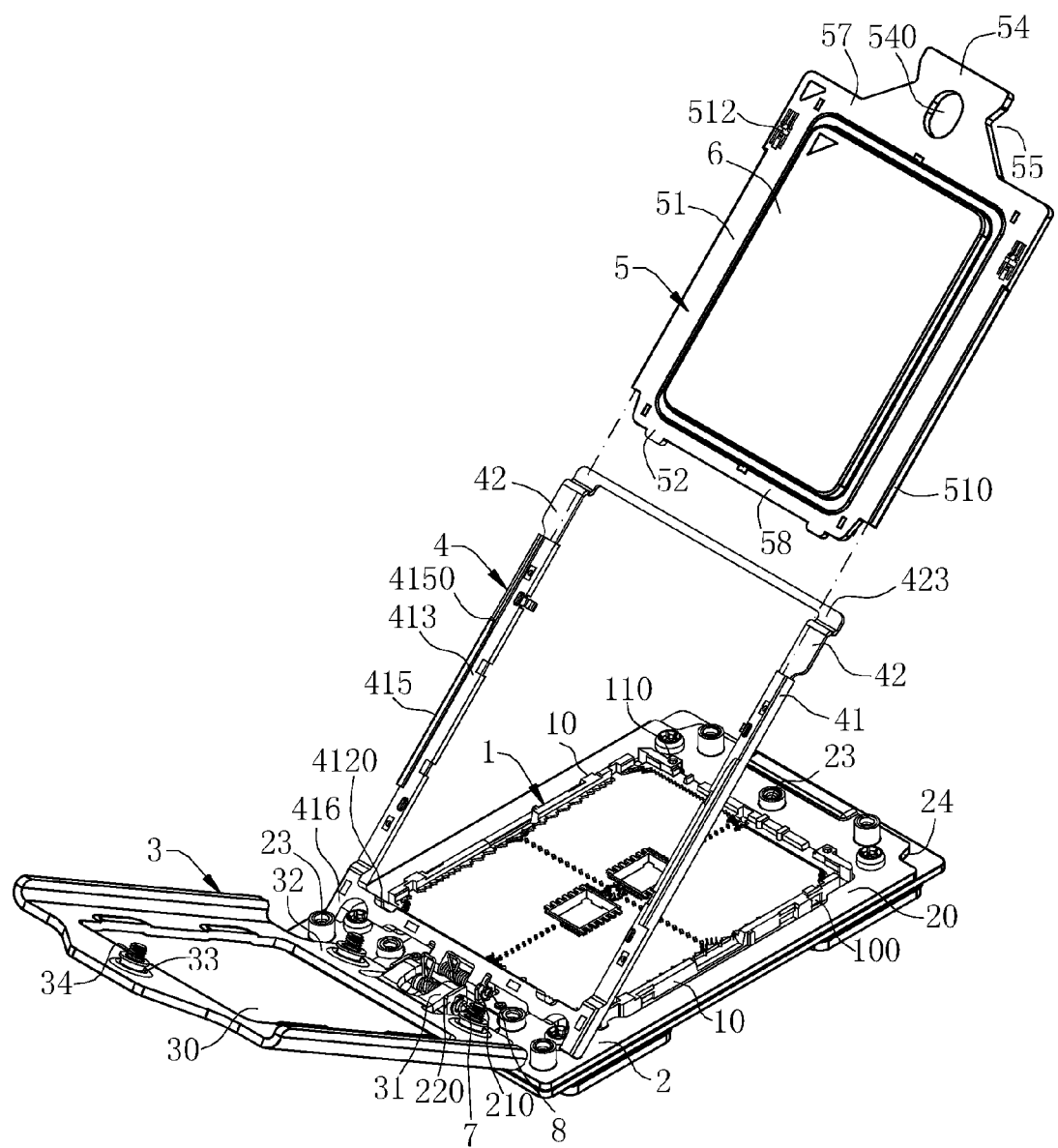
FIG. 4 is a schematic diagram showing that a clamping member of the electrical connector according to the first embodiment of the present invention is installed to a guide frame.
Figure 5:
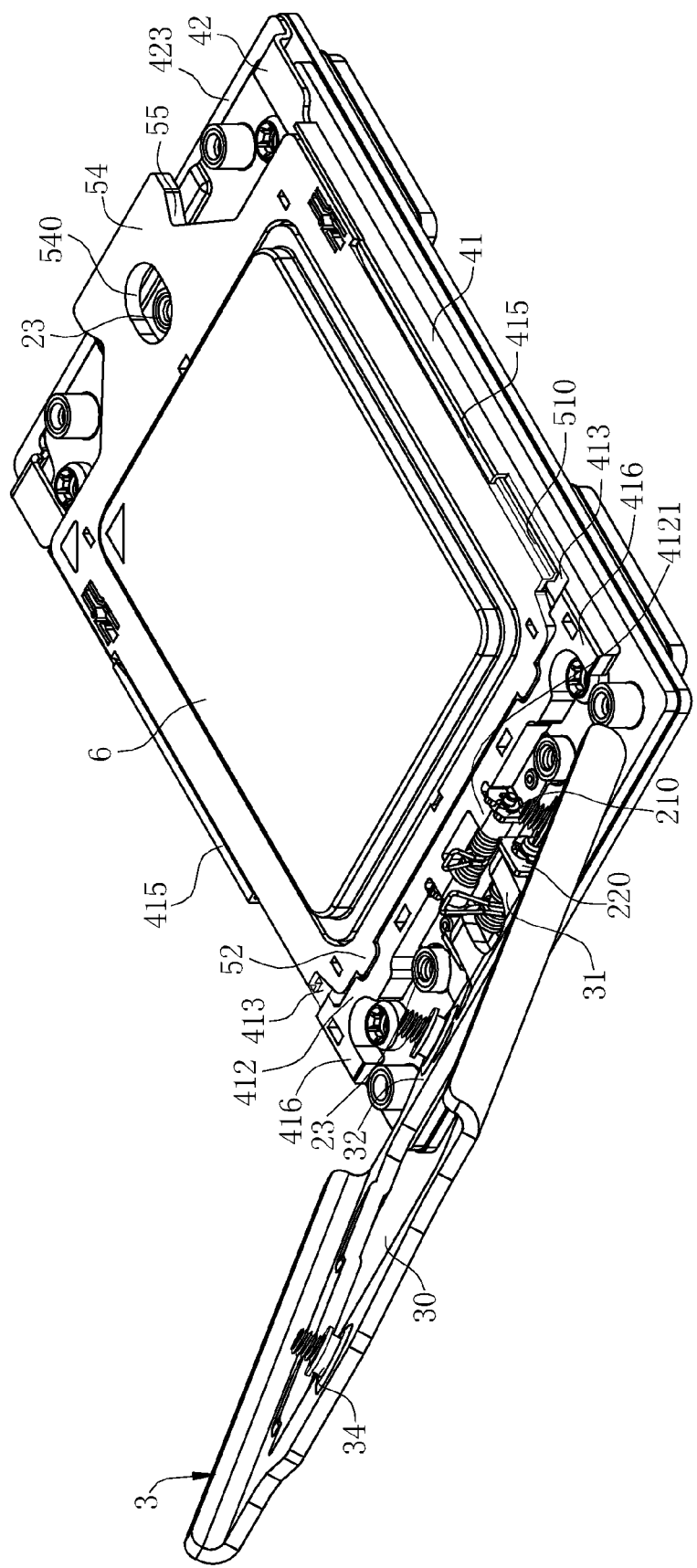
FIG. 5 is a schematic diagram showing that a guide frame of the electrical connector according to the first embodiment of the present invention is closed by rotation.
Figure 6:
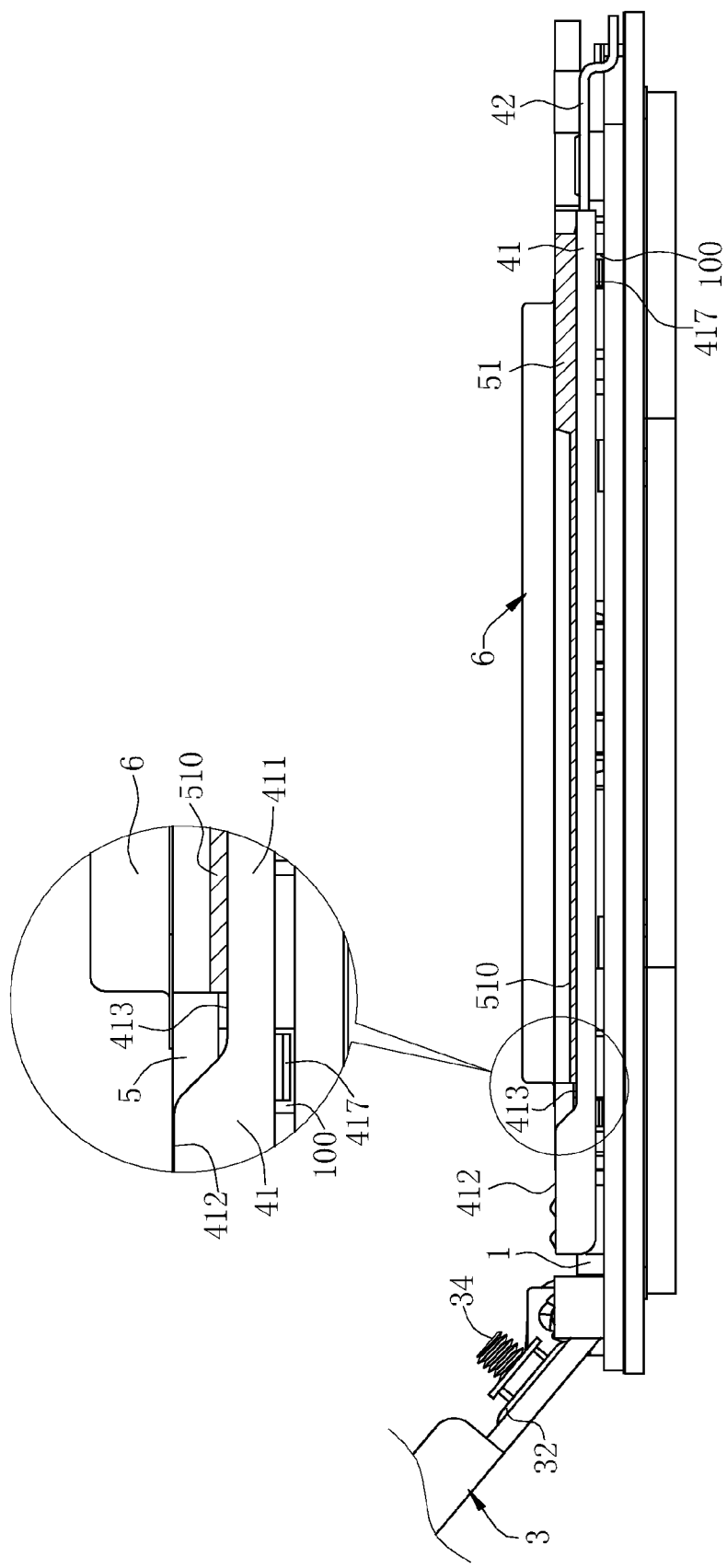
FIG. 6 is a side view showing that a guide frame of the electrical connector according to the first embodiment of the present invention is closed by rotation.
Figure 7:
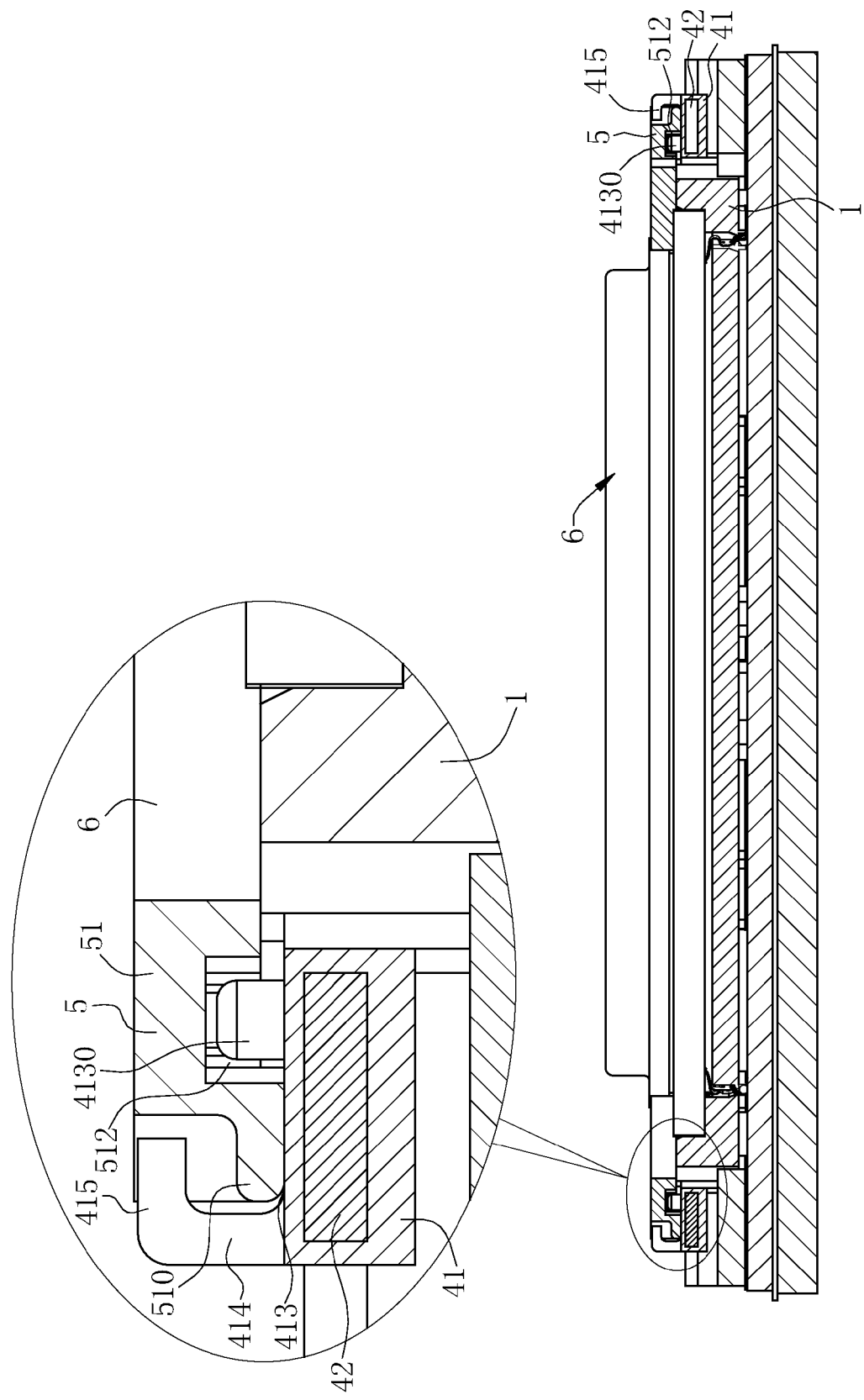
FIG. 7 is a sectional view showing that a guide frame of the electrical connector according to the first embodiment of the present invention is closed by rotation.
Figure 8:
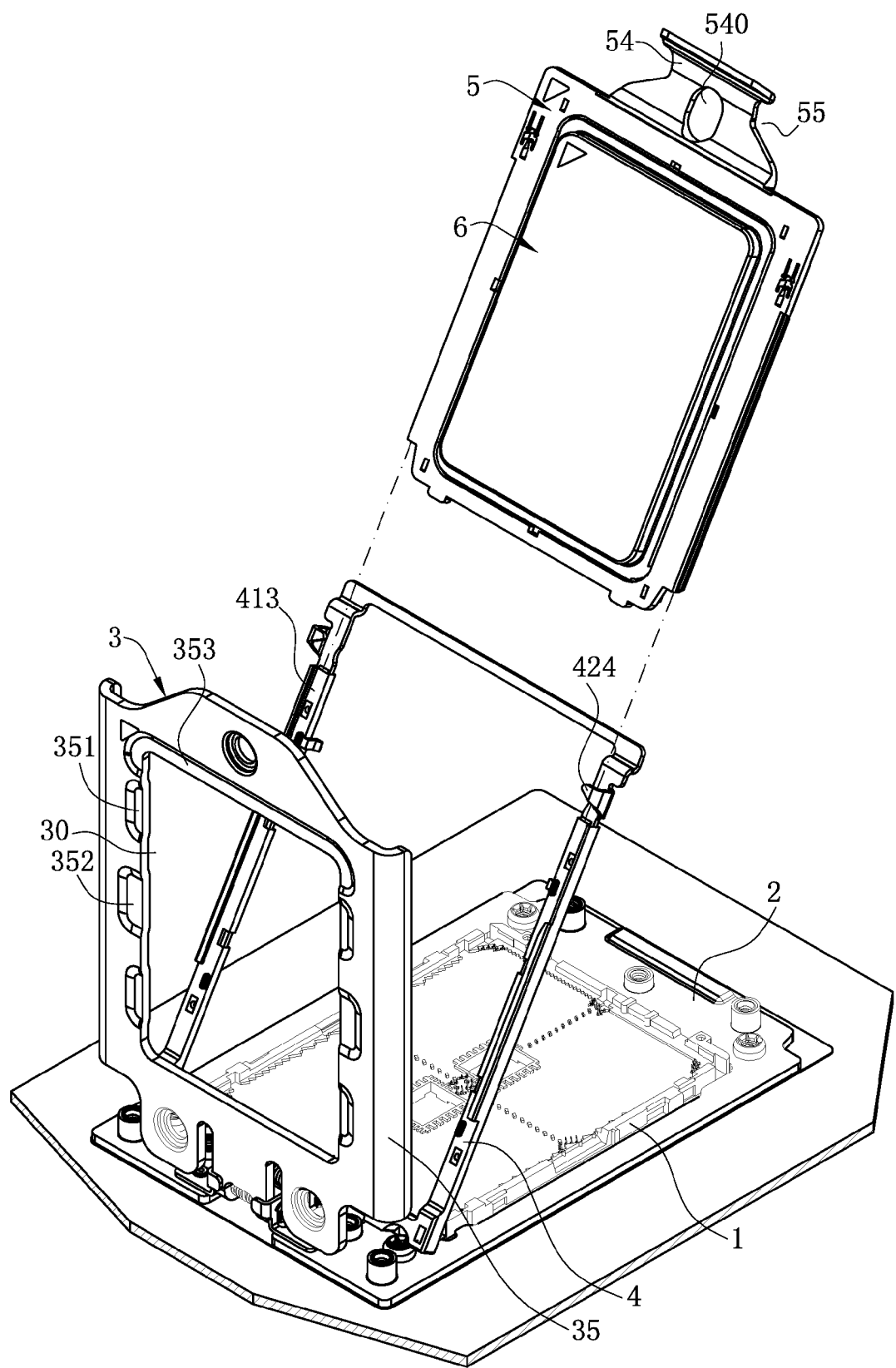
FIG. 8 is a schematic three-dimensional exploded view of an electrical connector according to a second embodiment of the present invention.
Figure 9:
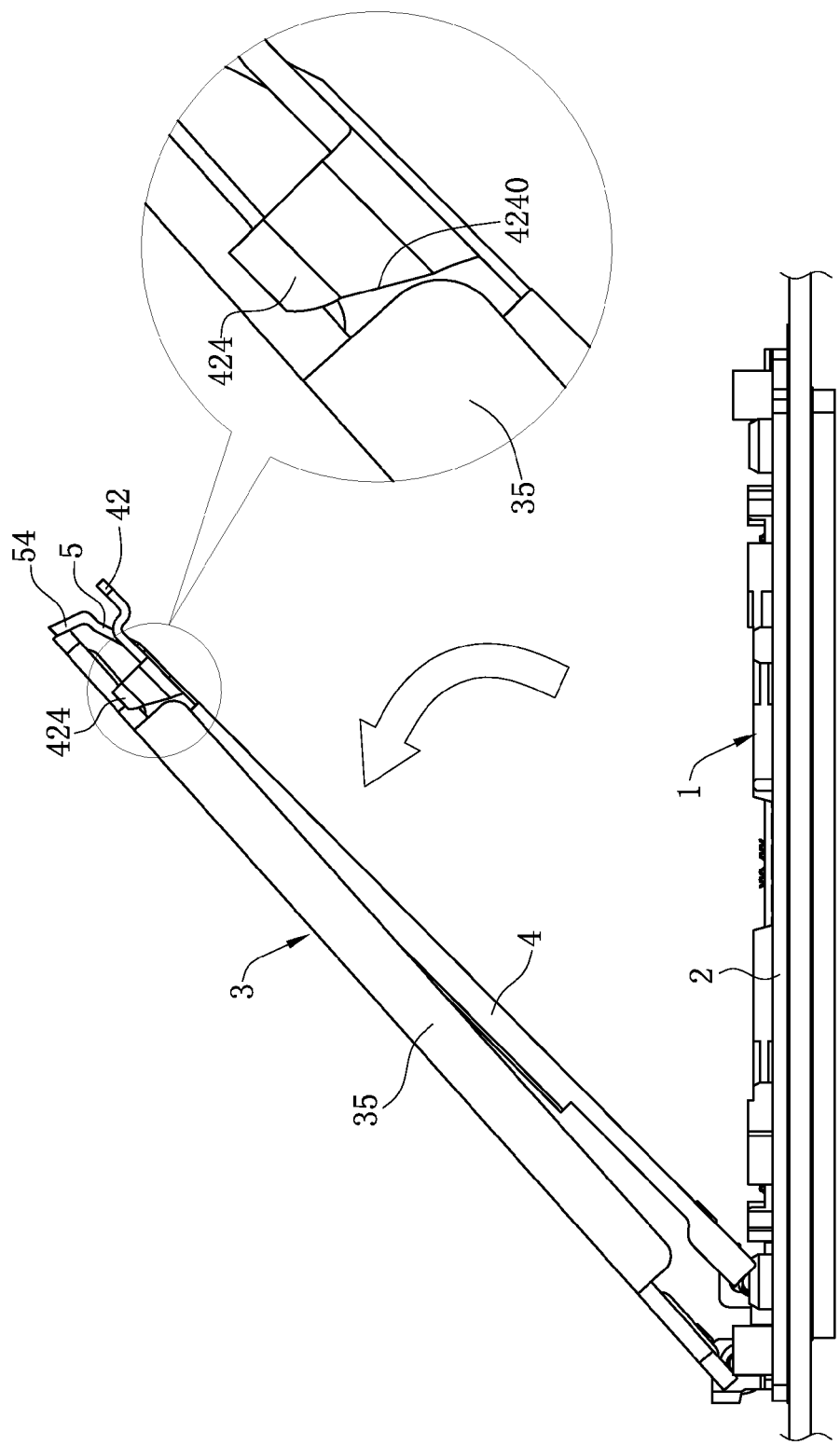
FIG. 9 is a side view of the electrical connector before assembling a chip module according to the second embodiment of the present invention.
Figure 10:
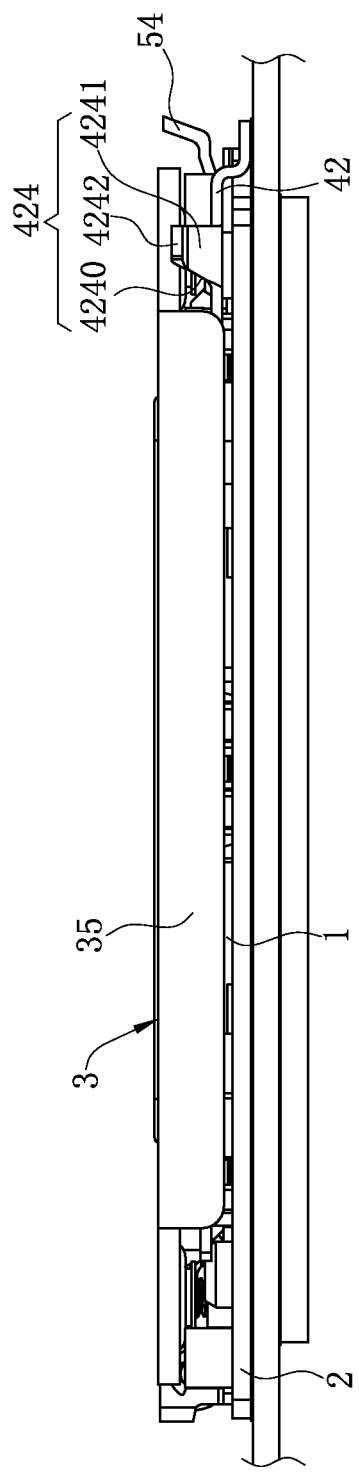
FIG. 10 is a side view of the electrical connector after closing of a load plate according to the second embodiment of the present invention.

As shown in FIGS. 1, 4 and 5, an electrical connector according to a first embodiment of the present invention is used for electrically connecting a chip module 6. The electrical connector includes an insulating body 1, multiple terminals (not labeled) fixed into the insulating body 1 and used for electrically connecting the chip module 6, a stiffener 2 located around the periphery of the insulating body, a carrier with a rear end pivoted onto the stiffener 2, used for carrying the chip module 6 onto the insulating body 1, and a load plate 3 also with a rear end pivoted to the stiffener 2, used for pressing the chip module 6.

As shown in FIGS. 1 and 4, the insulating body 1 is substantially rectangular. The insulating body 1 has a first side wall 10 at each of left and right sides of the insulating body 1, and a second sidewall 11 at each of front and rear ends of the insulating body 1. Each of the second sidewalls 11 connects the first sidewalls 10. Each of the first sidewalls 10 is concavely provided with a concave portion 100. An upper surface of each of the second sidewalls 11 is concavely provided with two positioning holes 110, and the positioning holes 110 penetrate lower surfaces of the second sidewalls 11.

As shown in FIGS. 1, 4 and 5, the stiffener 2 includes a bottom plate 20, and a first metal sheet 21 and a second metal sheet 22 riveted onto the bottom plate 20. The first metal sheet 21 is provided thereon with a first pivoting portion 210, and the second metal sheet 22 is provided thereon with a second pivoting portion 220. The bottom plate 20 is a hollow frame surrounding the insulating body 1. The first pivoting portion 210 and the second pivoting portion 220 are located behind the insulating body 1, and the first pivoting portion 210 is located in front of the second pivoting portion 220. The bottom plate 20 is provided with three locking portions 23. Two of the locking portions 23 are located on left and right sides of the second pivoting portion 220, and another locking portion 23 is located in front of the insulating body 1. A front end of the bottom plate 20 is further provided with a reserved slot 24.

As shown in FIGS. 1, 4 and 5, the load plate 3 is made of a metal material. The middle of the load plate 3 is provided with a through hole 30 for the chip module 6 to pass through. A rear end of the load plate 3 is provided with a bending portion 31. The bending portion 31 is pivoted to the second pivoting portion 220 through a first fixing pin 7. A protruding portion 32 protrudes backward on each of two opposite sides of the bending portion 31 from the load plate 3. The load plate 3 is provided with three receiving holes 33 corresponding to the three locking portions 23. One receiving hole 33 is located in front of the through hole 30, the other two receiving holes 33 are located behind the through hole 30 and disposed at the protruding portions 32. A locking member 34 passes through the receiving holes 33 to be locked with the locking portions 23 so as to fix the load plate 3 onto the stiffener 2. In this embodiment, the locking member 34 is a screw.

Figure 3:
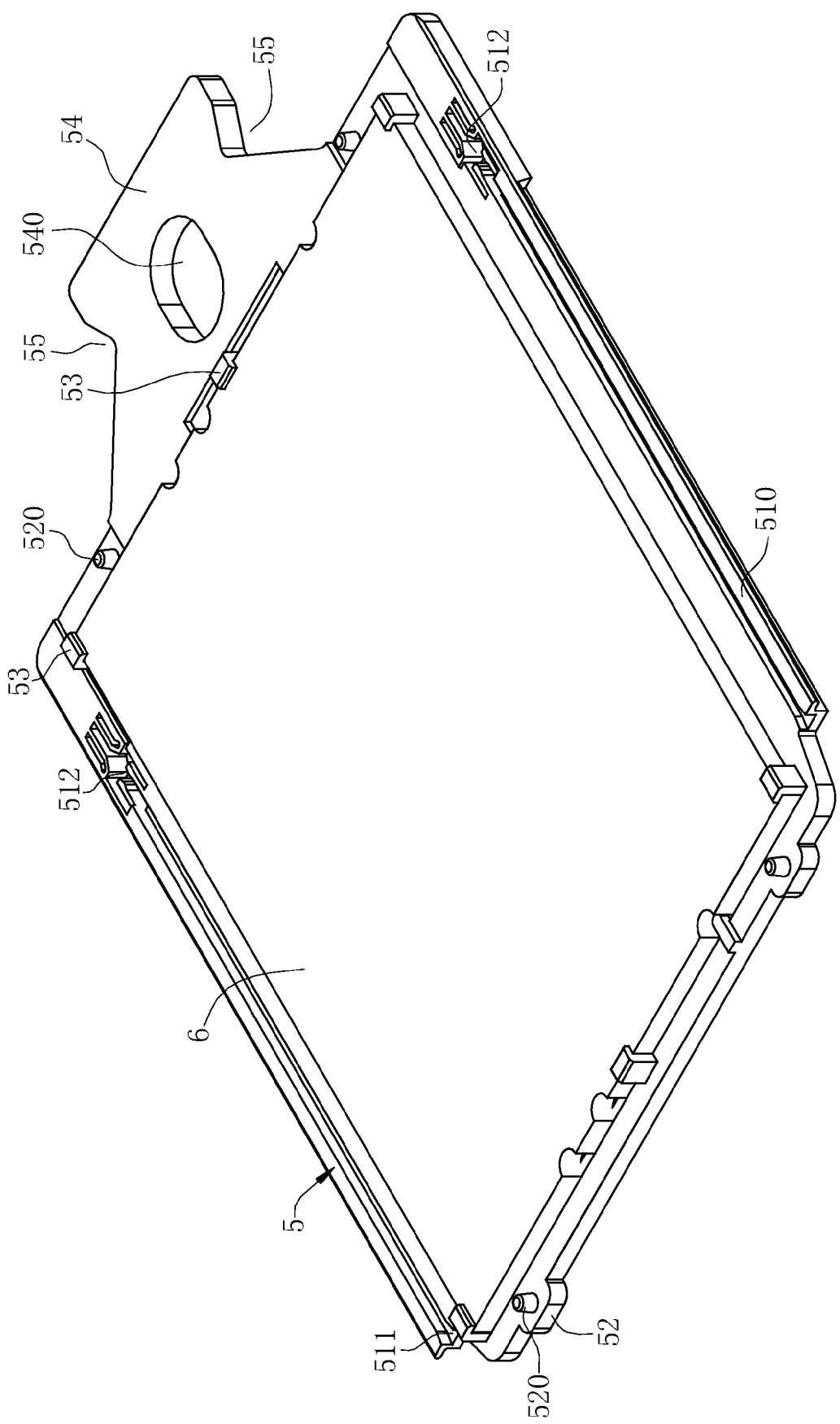
FIG. 3 is a schematic diagram showing that a chip module of the electrical connector according to the first embodiment of the present invention is installed to a clamping member.

As shown in FIGS. 1, 3 and 4, the carrier includes a guide frame 4 pivoted to the first pivoting portion 23 and a clamping member 5 used for fixing the chip module 6 (in this embodiment, the carrier may only have the clamping member 5 which is directly pivoted to the first pivoting portion 23). The clamping member 5 is made of a plastic material. The clamping member 5 has a side plate 51 at each of two opposite sides thereof, and a front plate 57 and a rear plate 58 connected to the two side plates 51. The two side plates 51, the front plate 57 and the rear plate 58 define a receiving hole 50 for the chip module 6 to pass through. An upper surface of each of the side plates 51 is concavely provided with a groove 510, a bottom surface of each of the side plates 51 is provided with a sliding slot 511, and a front end of each of the sliding slots 511 is provided with a fixing hole 512. Two protruding blocks 52 protrude horizontally from a rear end of the rear plate 58. The clamping member 5 is provided with four positioning portions 520 corresponding to the four positioning holes 110. Two of the positioning portions 520 are disposed at lower surfaces of the protruding blocks 52, the other two positioning portions 520 are disposed at a lower surface of the front plate 57. The positioning portions 520 are big-end-up cylinders. The positioning portions 520 cooperate with the positioning holes 110 to position the clamping member 5 to the insulating body 1. The clamping member 5 is provided with six fixing portions 53. The fixing portions 53 are hooks clipping to a bottom surface of the chip module 6, to fix the chip module 6 to the clamping member 5. The clamping member 5 is provided with a grasping portion 54 protruding forward from the front plate 57. Two sides of the grasping portion 54 have grasp spaces 55 for an operator to grasp the clamping member 5. The grasping portion 54 is provided with a perforation 540 located below the receiving hole 33 for the locking member 34 to pass through. The length of the perforation 540 along a front-rear direction is greater than the length along a left-right direction.

As shown in FIGS. 1, 2, 4 and 5, the guide frame 4 includes a plastic member 41 and a metal member 42 insert molded to the plastic member 41, to increase strength of the plastic member 41. The height of the guide frame 4 is not higher than an upper surface of the side plate 51. The plastic member 41 is substantially U-shaped, and has two opposite side arms 411 and a pivoting arm 412 connected to the two side arms 411. The pivoting arm 412 is pivoted to the first pivoting portion 210 through a second fixing pin 8. The pivoting arm 412 is concavely provided with two receiving grooves 4120 to receive the protruding blocks 52. Each of the two side arms 411 is provided with a sliding rail 413. The two sliding rails 413 are located on two opposite sides of the insulating body 1 respectively. Upper surfaces of the sliding rails 413 are not higher than the upper surface of the insulating body 1. The side plates 51 respectively slide on the sliding rails 413, and the sliding rails 413 are located between the stiffener 2 and the side plates 51. The upper surfaces of the sliding rails 413 are provided with two convex pillars 4130. The convex pillars 4130 respectively enter into the sliding slots 511 to guide the clamping member 5 to slide, and when the convex pillars 4130 slide in the sliding slots 511 to where the convex pillars 4130 are snapped to the fixing holes 512, the clamping member 5 stops sliding. A first stopping portion 414 is formed by extending upward from each of the sliding rails 413 to be stopped to a side edge of the side plate 51, a second stopping portion 415 is formed by extending horizontally from the first stopping portion 414 to be stopped above the groove 510. The second stopping portion 415 is not higher than the upper surface of the corresponding side plate 51. A front end of the second stopping portion 415 has a guide surface 4150 used for guiding the clamping member 5 to enter into the guide frame 41. A front end of each of the first stopping portions 414 is flush with a front end of the corresponding sliding rail 413. The front end of each of the second stopping portions 415 is not flush with the front end of the corresponding sliding rail 413. A resisting portion 416 extends from each of the sliding rails 413 along a length direction of the sliding rail 413. An upper surface of the resisting portion 416 is higher than an upper surface of the sliding rail 413. The resisting portion 416 resists the stiffener 2 downward to prevent the guide frame 4 from rotating excessively. Each of the side arms 411 is provided with a hook portion 417. The hook portions 417 are respectively snapped into the concave portions 100, to buckle the guide frame 4 onto the insulating body 1. The metal member 42 has two opposite first arms 421, and a second arm 422 and a third arm 423 connected to the two first arms 421. The third arm 423 is located in front of the second arm 422. The two first arms 421, the second arm 422 and the third arm 423 define an opening 420 for the chip module 6 to pass through, and the grasp spaces 55 are in communication with the opening 420. The first arms 421 are insert molded into the side arms 411, and the first arms 421 go beyond the side arms 411 along their length directions. The second arm 422 is insert molded into the pivoting arm 412. The third arm 423 bends downward from the first arms 421 to be lower than the fixing portion 53, to reserve the fixing portion 53 when the clamping member 5 is installed to the guide frame 4. The third arm 423 is received in the reserved slot 24.

When in use, at first, the chip module 6 is installed into the clamping member 5, and the clamping member 5 slides on the sliding rail 413 from front to back along a direction parallel to an upper surface of the guide frame 4, and stops sliding when the convex pillars 4130 are snapped to the fixing holes 512; then, the guide frame 4 is rotated downward, the positioning portions 52 of the rear plate 58 are first positioned into the positioning holes 110 of the insulating body 1, and the hook portion 417 of the guide frame 4 is then snapped with the concave portion 100 of the insulating body 1, to cause the chip module 6 to be aligned with the insulating body 1; finally, the load plate 3 is rotated downward, and the locking member 34 is locked to the locking portion 23, so that the load plate 3 is fixed onto the stiffener 2, to cause the load plate 3 to press the chip module 6 to fully urge the terminals (not shown).

FIGS. 8-11 schematically show an electrical connector according to a second embodiment of the present invention. The differences between the second embodiment and the first embodiment are as follows. The load plate 3 has a side portion 35 at each of left and right side of the through hole 30. A bottom surface of each of the side portions 35 is protruded with two first pressing portions 351 and a second pressing portion 352 located between the two first pressing portions 351, for pressing the chip module 6. A width of each of the second pressing portions 352 in the left and right direction is greater than a width of the corresponding first pressing portions 351, so as to avoid deformation of the load plate 3 when the load plate 3 presses the chip module 6. The bottom surface of the load plate 3 is further protruded with a third pressing portion 353. The third pressing portion 353 is located in the front of the first pressing portions 351 and the second pressing portions 352, and the third pressing portion 353 extends from the left side of the through hole 30 to the right side of the through hole 30.

Figure 11:
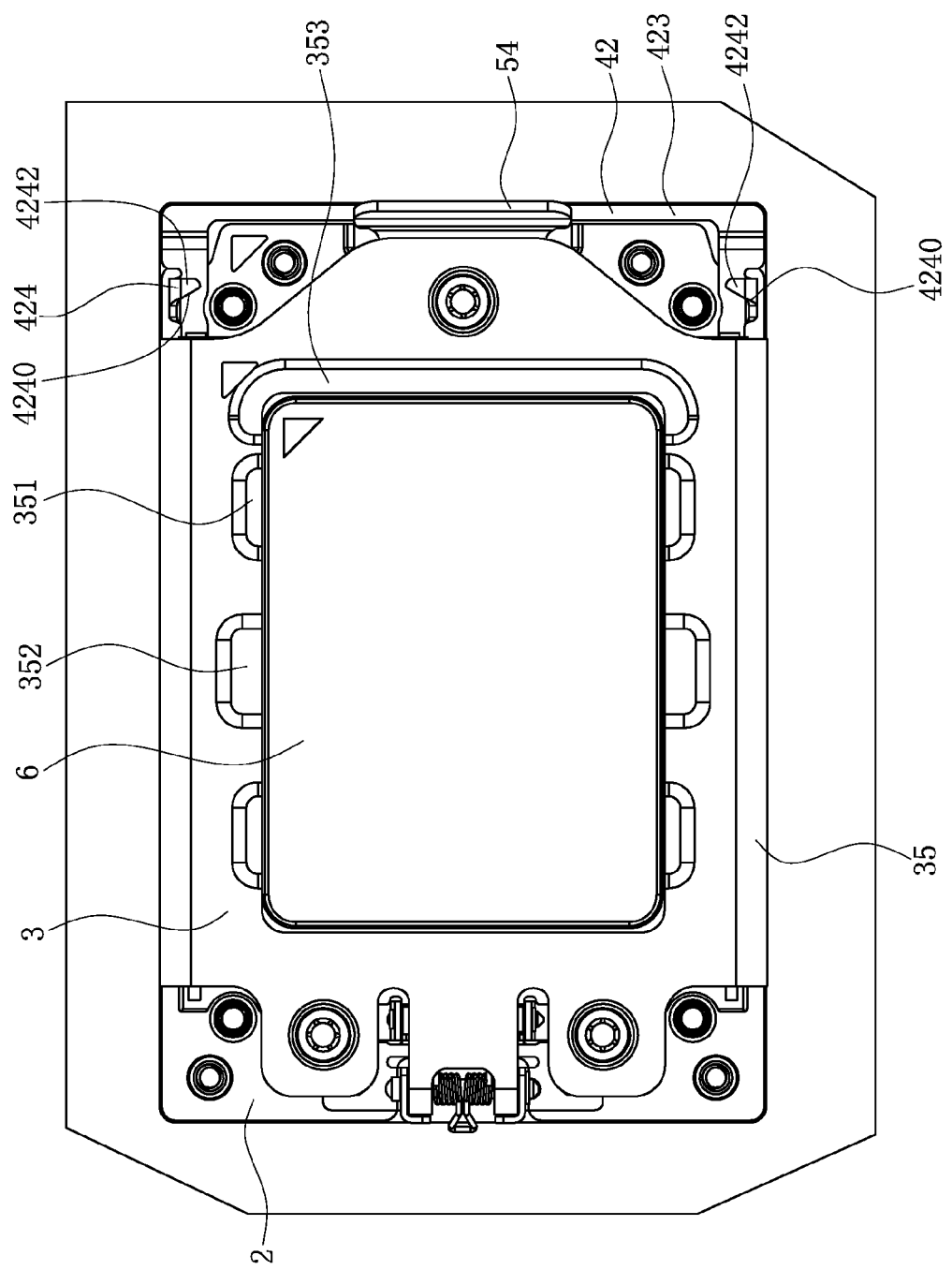
FIG. 11 is a top view of the electrical connector after closing of a load plate according to the second embodiment of the present invention.
Figure 12:
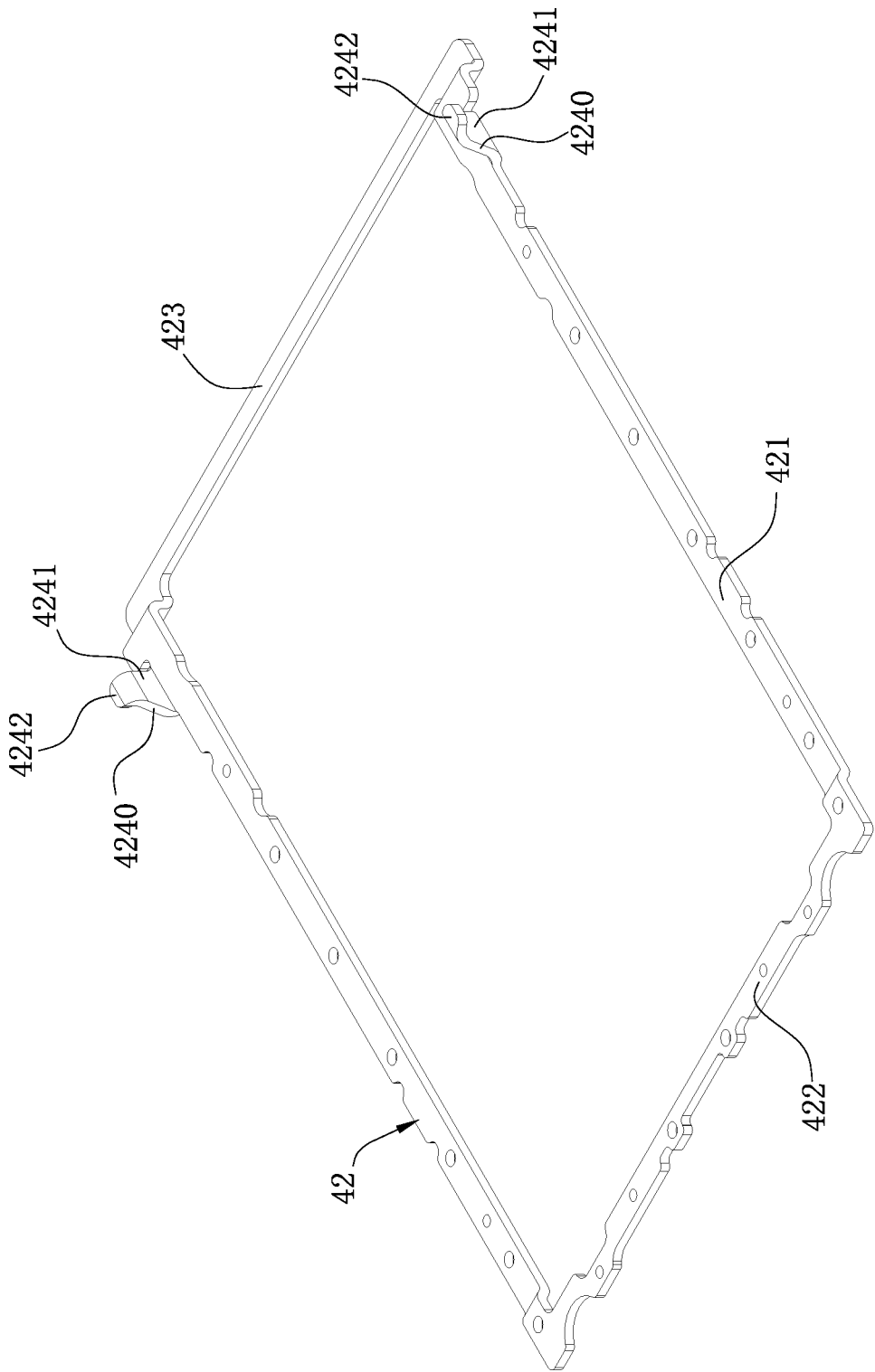
FIG. 12 is a schematic three-dimensional view of a metal member of an electrical connector according to a third embodiment of the present invention.
Figure 13:
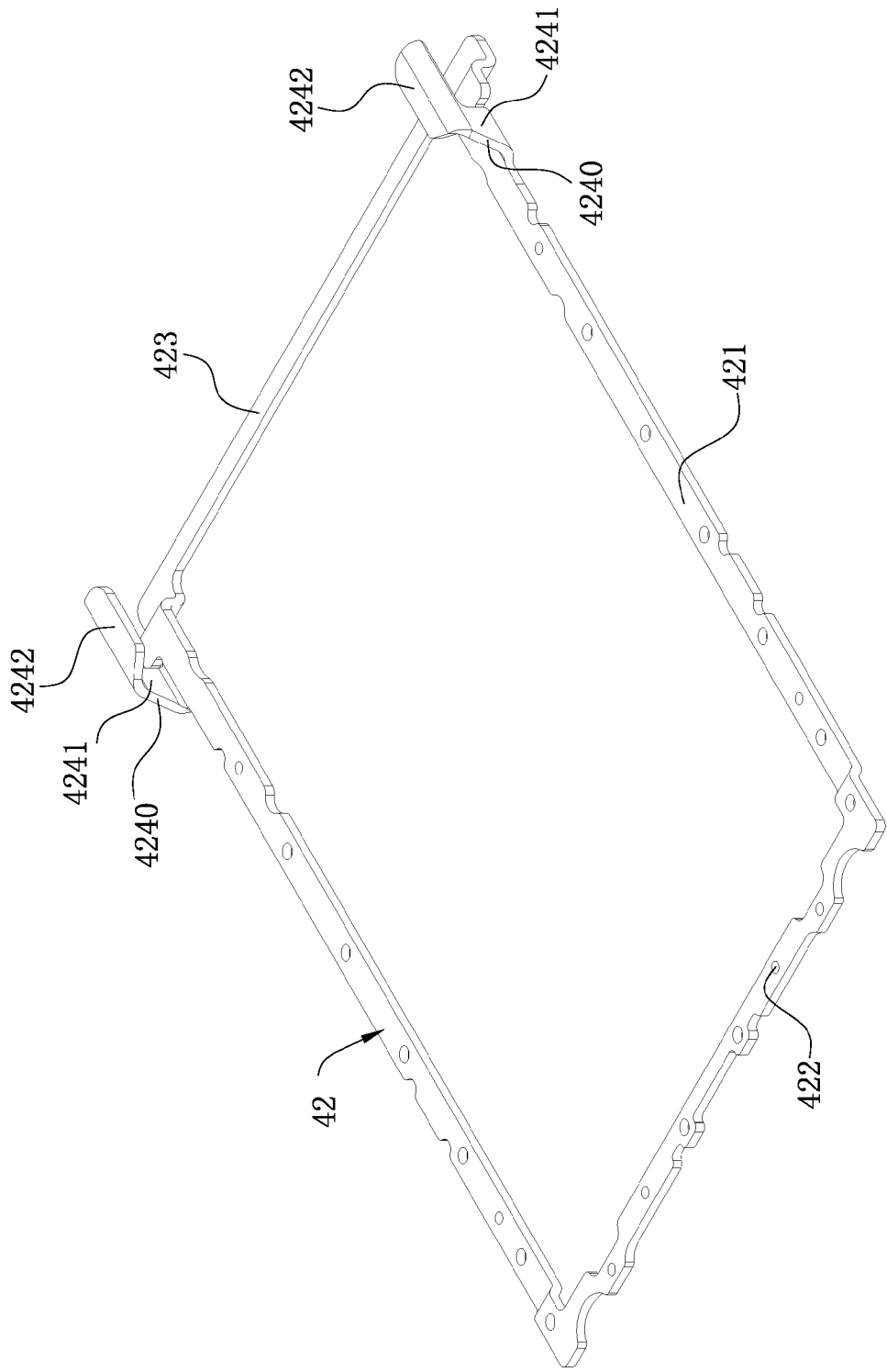
FIG. 13 is a schematic three-dimensional view of a metal member of an electrical connector according to a fourth embodiment of the present invention.

In certain embodiments, each of the left side and the right side of the metal member 42 is extended upward to form an operation portion 424, for an operator to rotate the guide frame 4 (in other embodiments, the number of the operating portions 424 may be one; i.e., the operating portion 424 is disposed only in the left side of the metal member 42 or the right side of the metal member 42). The operating portions 424 are located in the front of the sliding rails 413. When the clamping member 5 is slidably assembled to the guide frame 4, the operating portions 424 stop at two opposite sides of the clamping member 5. When the load plate 3 is in a close state, the operating portions 424 is located at the front of the side portions 35. Side edges of the operating portions 424 do not extend beyond side edges of the load plate 3. Each of the operating portion 424 has a chamfer 4240 disposed at the rear side thereof. The chamfer 4240, from bottom upward, is slant away from the corresponding side portion 35. When the chip module 6 is not assembled, the load plate 3 is opened, and the guide frame 4 is rotated to open, and in this process, there is a clearance between each of the chamfers 4240 and the corresponding side portion 35, so that the interference between the operation portion 424 and the corresponding side portion 35 is avoided. Each of the operating portions 424 has a connecting portion 4241 extending upward, and a holding portion 4242 bending and extending laterally from the connecting portion 4241. As shown in FIG. 11, each of the holding portions 4242 bends inward. In other embodiments, as shown in FIG. 12, each of the holding portions 4242 may also bend outward from the corresponding connecting portion 4241. In further embodiments, as shown in FIG. 13, each of the holding portions 4242 may extend forward and exceed the corresponding connecting portion 4241, such that the area of the holding portions 4242 is large, and it is easy for the operator to hold the holding portions 4242.

In summary, the electrical connector according to certain embodiments of the present invention, among other things, has the following beneficial effects.

(1) The stiffener 2 is provided with the first pivoting portion 210 and the second pivoting portion 220 which are located on the same side of the insulating body 1, the carrier is pivoted to the first pivoting portion 210, and the load plate 3 is pivoted to the second pivoting portion 220, so that the carrier and the load plate 3 are opened on the same side of the insulating body 1, thus occupying a small space of the circuit board.

(2) The clamping member 5 is slidably installed on the guide frame 4, thus reducing the difficulty of assembling and disassembling the clamping member 5.

(3) The sliding rails 413 of the guide frame 4 are located between the stiffener 2 and the side plates 51 of the clamping member 5, which can save space.

(4) The guide frame is provided with the resisting portion 416 to resist the stiffener 2 downward, which can prevent the guide frame 4 from rotating excessively.

(5) Two sides of the grasping portion 54 have grasp spaces 55, and the grasp spaces 55 are in communication with the opening 420, which facilitates grasp and saves the space.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails;
   wherein when the clamping member is assembled on the guide frame and the guide frame moves towards a closing direction to be installed on the insulating body, the sliding rails are located on two opposite sides of the insulating body and located between the stiffener and the side plates; and
   wherein an upper surface of each of the sliding rails is not higher than an upper surface of the insulating body.

2. The electrical connector of claim 1, wherein a grasping portion protrudes forward from the clamping member, two sides of the grasping portion have grasp spaces, and the grasp spaces are in communication with the opening.

3. The electrical connector of claim 1, wherein the load plate is provided with a through hole for receiving the chip module, a protrusion protrudes downward from the load plate, and at least a part of the protrusion is located at a corner of the through hole.

4. The electrical connector of claim 1, wherein the load plate is provided with a through hole for receiving the chip module, a protrusion protrudes downward from the load plate, and at least a part of the protrusion is located in front of the through hole.

5. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails;
   wherein a first stopping portion is formed by extending upward from each of the sliding rails to be stopped to a side edge of corresponding one of the side plates, a second stopping portion is formed by extending horizontally from each of the first stopping portion, a front end of each of the first stopping portion is flush with a front end of corresponding one of the sliding rails, and the front end of each of the second stopping portion is not flush with the front end of corresponding one of the sliding rails; and
   wherein a groove is concavely disposed from an upper surface of the side plate, the second stopping portion is stopped above the groove, and the second stopping portion is not higher than the upper surface of the side plate.

6. The electrical connector of claim 5, wherein a front end of each of the second stopping portions has a guide surface for guiding the clamping member to be assembled to the guide frame.

7. The electrical connector of claim 5, wherein a grasping portion protrudes forward from the clamping member, two sides of the grasping portion have grasp spaces, and the grasp spaces are in communication with the opening.

8. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails; and
   wherein the insulating body has a concave portion, the guide frame has a hook portion corresponding to the concave portion, and in a process that the carrier is installed to the insulating body downward, the hook portion cooperates with the concave portion to buckle the carrier to the insulating body.

9. The electrical connector of claim 8, wherein the insulating body has a positioning hole, the concave portion is located in front of the positioning hole, the clamping member has a positioning portion corresponding to the positioning hole, and in the process that the carrier is installed to the insulating body downward, the positioning portion cooperates with the positioning hole to position the carrier before the hook portion cooperates with the concave portion to buckle the carrier to the insulating body.

10. The electrical connector of claim 9, wherein the clamping member is horizontally convexly provided with a protruding block, and the guide frame is provided with a receiving groove to receive the protruding block.

11. The electrical connector of claim 10, wherein the positioning portion protrudes from a lower surface of the protruding block.

12. The electrical connector of claim 8, wherein the clamping member is horizontally convexly provided with a protruding block, and the guide frame is provided with a receiving groove to receive the protruding block.

13. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails; and wherein the guide frame comprises a plastic member and a metal member insert molded to the plastic member, the plastic member has two opposite side arms and a pivoting arm connected to the two side arms, the side arms are provided with the sliding rails, and the pivoting arm is pivoted to the first pivoting portion.

14. The electrical connector of claim 13, wherein the metal member is provided with two opposite first arms, and a second arm and a third arm connected to the two first arms, the first arms are insert molded into the side arms and the first arms go beyond the side arms along their length directions, the second arm is insert molded into the pivoting arm, and the third arm bends downward from the first arms to reserve the clamping member when the clamping member is installed to the guide frame.

15. The electrical connector of claim 14, wherein the stiffener is provided with a reserved slot to receive the third arm.

16. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails; and
   wherein the guide frame comprises a plastic member and a metal member insert molded to the plastic member, the plastic member has two opposite side arms and a rear arm connected to the two side arms, the side arms are provided with the sliding rails.

17. The electrical connector of claim 16, wherein the metal member is provided with two opposite first arms, and a second arm and a third arm connected to the two first arms, the first arms are insert molded into the side arms and the first arms go beyond the side arms along their length directions, the second arm is insert molded into the rear arm, and the third arm bends downward from the first arms to reserve the clamping member when the clamping member is installed to the guide frame.

18. The electrical connector of claim 17, wherein the stiffener is provided with a reserved slot to receive the third arm.

19. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the load plate is provided with a through hole for receiving the chip module, and the load plate is provided with a receiving hole in each of front of and behind the through hole for a locking member to pass through to fix the load plate onto the stiffener; and
   wherein the load plate is provided with two protruding portions and a bending portion pivoted to the second pivoting portion, the bending portion is located between the two protruding portions, and each of the two protruding portions is provided with the receiving hole.

20. The electrical connector of claim 19, wherein a grasping portion protrudes forward from the carrier, and the grasping portion is provided with a perforation located below the receiving hole for the locked member to pass through.

21. The electrical connector of claim 19, wherein the load plate is provided with a through hole for receiving the chip module, a protrusion protrudes downward from the load plate, and at least a part of the protrusion is located at a corner of the through hole.

22. The electrical connector of claim 19, wherein the load plate is provided with a through hole for receiving the chip module, a protrusion protrudes downward from the load plate, and at least a part of the protrusion is located in front of the through hole.

23. An electrical connector for electrically connecting a chip module, comprising:
   an insulating body;
   a plurality of terminals received in the insulating body, for electrically connecting the chip module;
   a stiffener surrounding the periphery of the insulating body, wherein the stiffener has a first pivoting portion and a second pivoting portion, the first pivoting portion is located in front of the second pivoting portion, and the first pivoting portion and the second pivoting portion are located on a same side of the insulating body;
   a carrier for carrying the chip module onto the insulating body, wherein a rear end of the carrier is pivoted to the first pivoting portion; and
   a load plate for pressing the chip module, wherein a rear end of the load plate is pivoted to the second pivoting portion,
   wherein the carrier comprises:
      a guide frame pivoted to the first pivoting portion; and
      a clamping member for fixing the chip module;
   wherein the guide frame has four edges defining an opening for receiving the chip module, a sliding rail is provided on each of two opposite sides of the opening, a side plate is provided on each of two opposite sides of the clamping member, and the two side plates are respectively carried on the two sliding rails and are slidable along the two sliding rails;

wherein the load plate has a through hole for receiving the chip module, and two side portions extending from a left side and a right side of the through hole;

wherein the guide frame has an operating portion extending upward from a left or a right side of the guide frame to operate rotation of the guide frame; and when the load plate is in a closed state, the operating portion is located at a front of corresponding one of the side portions.

24. The electrical connector of claim 23, wherein the operating portion has a chamfer disposed at a rear side, the chamfers, from bottom upward, is slant away from the corresponding one of the side portions.

25. The electrical connector of claim 24, wherein both the left side and the right side of the guide frame has the operating portion, the operating portions are located in a front of the sliding rails, and when the clamping member is slidably assembled to the guide frame, the operating portions stop at a left side and a right side of the clamping portion.

26. The electrical connector of claim 24, wherein the operating portion has a connecting portion extending upward, and a holding portion bending and extending laterally from the connecting portion, and the holding portion extends frontward and exceeds the connecting portion.

27. The electrical connector of claim 24, wherein a grasping portion protrudes forward from the clamping member, two sides of the grasping portion have grasp spaces, and the grasp spaces are in communication with the opening.

28. The electrical connector of claim 23, wherein a grasping portion protrudes forward from the clamping member, two sides of the grasping portion have grasp spaces, and the grasp spaces are in communication with the opening.

29. The electrical connector of claim 23, wherein both the left side and the right side of the guide frame has the operating portion, the operating portions are located in a front of the sliding rails, and when the clamping member is slidably assembled to the guide frame, the operating portions stop at a left side and a right side of the clamping portion.

30. The electrical connector of claim 23, wherein the operating portion has a connecting portion extending upward, and a holding portion bending and extending laterally from the connecting portion, and the holding portion extends frontward and exceeds the connecting portion.

* * * * *